United States Patent [19]

Gardner

[11] Patent Number: 4,596,956
[45] Date of Patent: Jun. 24, 1986

[54] CURRENT AMPLIFIERS

[75] Inventor: John Gardner, Bramley, England

[73] Assignee: The Secretary of State for Defence in Her Britannic Majesty's Government of the United Kingdom of Great Britain and Northern Ireland, London, England

[21] Appl. No.: 665,382

[22] Filed: Oct. 26, 1984

[30] Foreign Application Priority Data

Oct. 27, 1983 [GB] United Kingdom ............... 8328836

[51] Int. Cl.⁴ .......................... H03F 1/02; H03F 3/68
[52] U.S. Cl. ........................................ 330/9; 330/51; 330/295
[58] Field of Search ............... 330/9, 51, 149, 124 R, 330/295

[56] References Cited

PUBLICATIONS

Jaeger, R. C., Hellwarth, G. A., "Dynamic Zero-Correction Method Suppresses Offset Error in OP Amps", Electronics, Dec. 4, 1972, pp. 109-110.

Primary Examiner—James B. Mullins
Assistant Examiner—G. Wan
Attorney, Agent, or Firm—William R. Hinds

[57] ABSTRACT

An electrometer amplifier with automatic zero-error correction in which the input current is switched periodically between two amplifier channels by twin reed switches 2,2', the channel outputs being switched in synchronism (15,15') to a common output 19. Each channel includes a current-to-voltage converter 3,4; 3',4' feeding an amplifier 8,9; 8',9', followed by an integrator and store 11,12,13; 11',12',13' whose output is continuously fed back negatively to the input of this amplifier but whose input is synchronously switched (10,10') into connection with the amplifier output only when that channel is disconnected from the input terminal 1. During the latter period capacitors 13,13' store a voltage corresponding to the zero error in the circuitry preceding amplifiers 8,8', so that the stored value (periodically updated) continues to cancel the zero error when terminal 1 is reconnected to that channel and switch 10,10' reopens.

19 Claims, 2 Drawing Figures

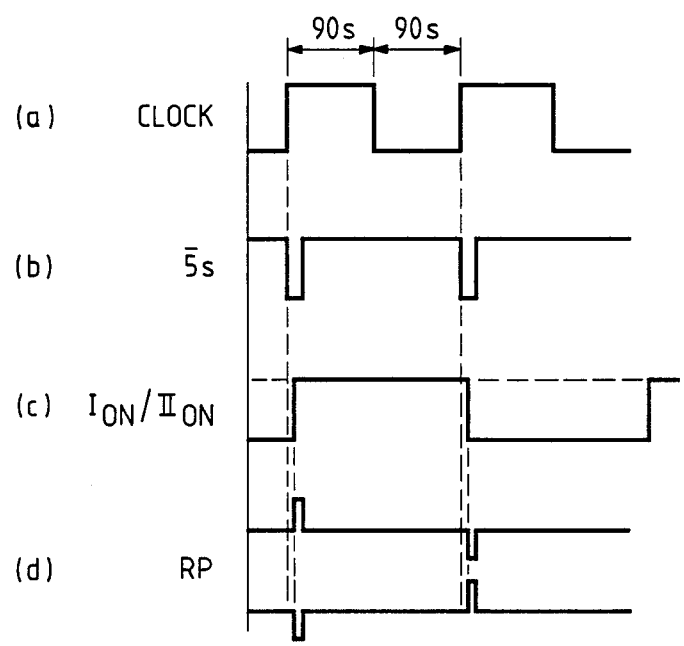

4,596,956

CURRENT AMPLIFIERS

BACKGROUND OF THE INVENTION

This invention relates to current amplifiers and in particular to electrometer amplifiers, ie amplifiers for measuring very small DC currents such as those from ionisation chambers, eg $10^{-10}$–$10^{-15}$ A.

As is known, such amplifiers usually require quite complex initial zero-setting procedures, and have subsequent drift problems. As regards zero-setting, the procedure may involve first short-circuiting the input current to ground to prevent charge build-up on the input insulator, and then in turn zero-setting for voltage by adjusting the amplifier operating conditions and zero-setting for bias current by adjusting a compensating current from an external source. Finally the input current is reconnected for the measurement. This procedure must be repeated periodically if the amplifier zero drifts with time, eg due to temperature changes, as is normal.

Arrangements for alleviating these problems are known in which the input current is automatically switched periodically between two identical amplifier channels. During the period the current is switched to each channel there is zero input to the other channel, and a zero-correction circuit associated with each channel automatically restores the zero condition in that other channel ready for the input current to be re-connected thereto. The channel outputs are switched in synchronism with the inputs. However, in such existing arrangements each zero-correction circuit acts only to adjust the amplifier operating conditions and makes no correction for change in bias current or for other unwanted changes.

SUMMARY OF THE INVENTION

The present invention provides a two-channel arrangement which overcomes the latter difficulty and has other advantages, eg the bias current can exceed the signal current by a large margin, allowing the use of low-cost conventional integrated-circuit amplifiers in the input stages rather than high-quality devices with special input characteristics.

According to the present invention a current amplifier comprises:

two similar amplifier channels each comprising a current-to-voltage converter having its output connected to respective DC voltage-amplifying means;

each channel further comprising integrator and store means for integrating the non-zero output of said voltage-amplifying means in the absence of an input signal to said converter, said integrator and store means having its input connectable to the output of said voltage-amplifier means and its output permanently connected to the input of said voltage-amplifying means for feeding a zero-correcting current thereto corresponding to the stored value;

switch means for connecting an input current terminal to the input of each said converter during alternate time periods;

switch means for connecting an output terminal to a zero-corrected point in each said voltage-amplifying means in synchronism with said connection of the input current terminal to the input of the corresponding converter;

switch means for disconnecting each said integrator and store means from the output of each said voltage-amplifier means while said input terminal is connected to the converter in that channel;

and timing means for periodically operating said switch means thereby to switch the input current between said two channels.

Each current-to-voltage converter may comprise an operational amplifier including a feedback resistor through which flows the input current.

Each integrator and store means may comprise an operational amplifier having a capacitor connected between its input and output, a resistor switchably connectable between its input and the output of the respective voltage amplifying means, and a resistor connected between its output and the input of said respective voltage-amplifying means.

Said output terminal may be preceded by switch means operable by said timing means to open for a short period bridging the switching of the input current between the two channels, and voltage storage means may be connected between said switch means and the output terminal.

The input terminal switch means may comprise two reed switches including actuating-coil means, each switch having one reed contact connected to said input terminal and another reed contact connected to the input of a respective current-to-voltage converter, and may include permanent magnet means to magnetically bias the respective switches in opposite senses. The magnet means may be arranged to bias the switches to a state in which they can be switched between stable make and break conditions by short pulses of opposite polarity applied to said actuating-coil means. The actuating-coil means may comprise a coil located between the two switches having a centre tapping connected to a neutral potential and switching connections to apply pulses of opposite polarities simultaneously to both ends, and the magnet means may comprise a separate magnet for each switch.

BRIEF DESCRIPTION OF THE DRAWINGS

To enable the nature of the present invention to be more readily understood, attention is directed, by way of example, to the accompanying drawings wherein:

FIG. 2 shows the relative timing of switching waveforms in the embodiment of FIG. 1.

DETAILED DESCRIPTION OF THE PREFERRED EMBODIMENTS

Figure 1:
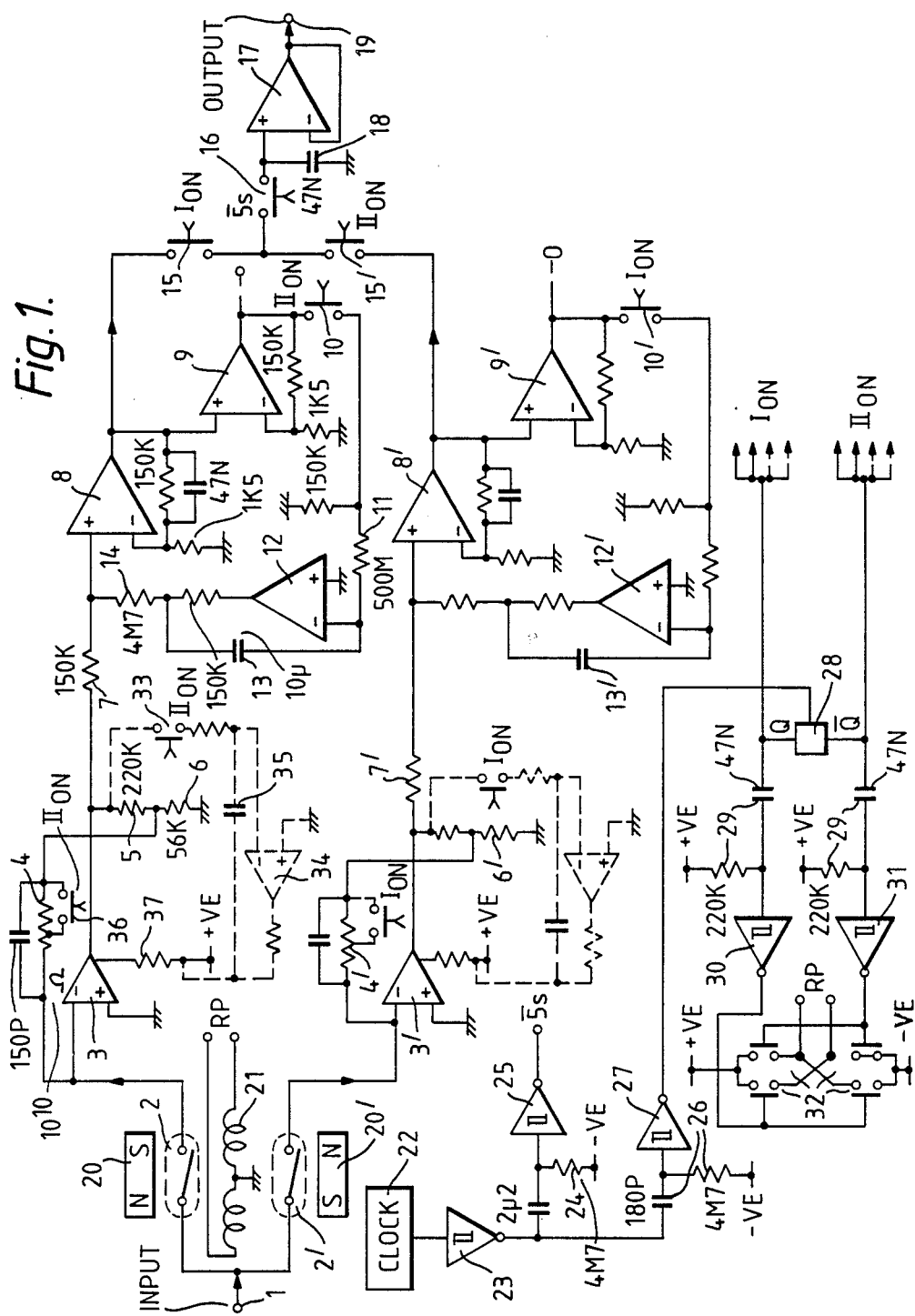
FIG. 1 is a circuit diagram of one current amplifier embodying the present invention.

FIG. 1 shows an amplifier intended for measuring small currents from an ionisation chamber. In FIG. 1 an input terminal 1 is connected through respective reed switches 2 and 2' to the inputs of respective operational amplifiers 3 and 3'. Amplifier 3 (suitably an integrated circuit Type ICL7622) includes a $10^{10}\Omega$ resistor 4 connected between its input and a potentiometer connected across its output formed by resistors 5 and 6 giving, with the values of the latter shown, a gain of 5. Amplifier 3 and its associated components act as a current-to-voltage converter in a known manner, its output voltage being proportional to the product of the output current and the value of resistor 4.

The output of amplifier 3 is connected via resistor 7 to the input of DC amplifier 8 (suitably an integrated circuit Type 741) having a gain of about 100, whose output is connected to the input of a similar amplifier 9.

The output of amplifier 9 is connected through a c-mos switch 10 and a high-value (500M) resistor 11 to the input of an operational amplifier 12 (suitably an integrated circuit Type ICL 7622). The latter has a large capacitor 13 (10μ) connected between input and output to function as an integrator and store circuit in a known manner. The output of the latter circuit is fed back to the input of amplifier 8 through a high-value (4M7) resistor 14. With switches 10 and 10' closed, the amplifiers 8,9 and 12, and the amplifiers 8', 9', and 12', are thus connected to form two negative feedback amplifier arrangements of high internal loop gain.

The above units and components 3–14 constitute one amplifier channel, channel I. A second identical channel, channel II is formed by units 3'–12' and associated components (not numbered).

The output of amplifier 8 is fed through c-mos switches 15 and 16 to a storage circuit comprising an operational amplifier 17 (suitably integrated circuit Type 741) having a capacitor 18 connected between its input and earth and fed back to form a sample-and-hold circuit, and hence to an output terminal 19. The output of amplifier 8' is likewise fed through c-mos switch 15' to switch 16. Terminal 19 thus delivers an output voltage proportional to the positive input current to terminal 1.

As will be described hereafter, the circuit includes timing means such that when switches 2 and 15 are closed, switch 10 is open and channel I is the effective amplifying channel, switches 2' and 15' being open and switch 10' closed during that period. During the subsequent period the switch states are reversed and channel II is the effective amplifying channel, and these periods alternate. Switch 16 opens for a short period bridging the changeover between channels, in order to avoid any consequential disturbances reaching output terminal 19.

In a known manner the reed switches 2 and 2' are biased in opposite senses by the permanent bar magnets 20, 20' to a level such that, owing to hysteresis, a short current pulse applied to ferrite-cored coil 21 terminals RP of one polarity will cause one switch (initially closed) to open to a stable "break" condition, and the other switch (initially open) to close to a stable "make" condition, whilst a subsequent short pulse of the opposite polarity will reverse these conditions. Coil 21 is aligned parallel to and between the switches with the magnets beyond the latter as shown, and is balanced about a central earthed tapping so that any switching transients picked up by the switch contacts, which are high-impedance points, tend to cancel out. Other coil/magnet arrangements are possible, provided the switch characteristics (shunt-resistance etc) are not degraded eg by contact with the coil. A suitable reed switch having the required high insulation for the present function is a Hamlin Inc Type MARR/15 8241U.

The various switching operations are performed by a timing circuit which comprises a clock circuit 22 which generates a square wave having alternate 90 s positive and negative portions (see FIG. 2(a)). This waveform is fed to a Schmitt trigger/inverter 23 whose output waveform is similar and is fed via differentiating circuit 24 to a Schmitt trigger/inverter 25 which, from the positive-going edges, generates 5 s negative pulses spaced 180 s apart (FIG. 2(b)). The output of circuit 23 is also fed via a second differentiating circuit 26 having a relatively short time-constant to a Schmitt trigger/inverter 27 which simultaneously generates similarly spaced 1 ms negative pulses (not shown). The output of circuit 27 is fed to a ÷2 circuit 28 triggered by the trailing edges of the pulses from circuit 27. Complementary square-wave outputs from circuit 28, having alternate 180 s positive and negative portions whose leading edges are delayed about 1 ms relative to the corresponding leading edges of the 5 s pulses from circuit 25, provide $I_{ON}$ and $II_{ON}$ switching waveforms (FIG. 2(c)) for the switches 10,10' and 15, 15'.

The complementary outputs of circuit 28 are differentiated by circuits 29 to trigger Schmitt trigger/inverters 30 and 31 which alternately produce a positive trigger pulse every 180 s. The pulses operate alternate pairs of the four c-mos switches 32 so that each terminal RP is alternately connected to the positive and negative supply lines for a period of 5 ms every 180 s to supply alternate polarity switching currents to coil 21 (FIG. 2(c)).

In the above-described circuit, the current-to-voltage converter circuits (amplifiers 3,3' etc) are supplied by +6.8 V, −6.8 V balanced supply lines, the amplifier and zero-correction circuits (amplifiers 8,8'; 9,9' and 12,12' etc) by +7.5 V, −7.5 V balanced supply lines, and the timing circuit (items 22 through 32 etc) from a 15 V unbalanced supply, with the component etc values shown.

In operation the RP pulses from switches 32 change over the reed switches 2,2' every 180 s so that the input current is fed to channels I and II alternately. The switches 10,10' and 15,15' are simultaneously operated by the $I_{ON}/II_{ON}$ waveform so that the switch 15 or 15' is closed in the operative channel, ie the channel connected to terminal 1, and the switch 10 or 10' open in that channel. Switch 16 is opened by the 5 s waveform during the changeover between channels as already described.

In the inoperative channel the input reed switch 2 or 2' is open and the switch 10 or 10' is closed. In that condition the input to amplifier 8 or 8' of the channel is constituted solely by any unwanted currents or voltages generated in the preceding part of that channel, ie in the converter 3 or 3' circuit, such as its amplifier bias current, offset voltage, any input leakage current, etc. The resulting output of circuit 3 or 3' is fed to the series-connected amplifiers 8,9 or 8',9' whose output is fed via the closed switch 10 or 10' to the integrator and storage circuit comprising amplifier 12 or 12' and associated components. The latter feeds a compensating current back to the input of amplifier 8 or 8', which is a summing junction, in a sense to cancel the input from circuit 3,3'. The earthed input terminals of amplifiers 12,12' form the reference point. When the channels change over, the switch 10 or 10' opens in the now operative (current-measuring) channel 1, leaving an appropriate charge stored on capacitor 13 and 13' which continues to feed the same compensating current to the input of amplifier 8 or 8'. Hence the latter now receives, in effect, three inputs, viz a wanted current to be measured (derived via reed switch 2 or 2', converter 3 or 3' and resistor 7 or 7'), an unwanted current from the converter 3 or 3' due to its bias current, offset voltage, etc., and a compensating current from capacitor 13 which continues to cancel the latter unwanted current as described. Consequently the output from terminal 19 represents substantially only the wanted current, ie the compensating current acts to correct the amplifier zero. Any slow changes in the unwanted current from the converter due to drifts therein, eg due to temperature changes, are compensated by an equivalent change in the voltage stored on capacitor 13 or 13' while the relevant channel is inoperative, so that the channel outputs continue to represent substantially only the wanted output current despite any such drifting. In fact the described arrangement allows wanted currents to be measured in the presence of much larger unwanted currents, owing to the cancellation of the latter, eg in the presence of large bias currents at the converter inputs.

The gains of the two amplifier channels can be readily equalised by adjusting the closed-loop gain of amplifier 3 or 3', by adjusting the value of resistor 6 or 6', to give equal outputs at terminal 19 for a constant input current. Alternatively resistors 4,4' can be selected to give equal gains. Calibration can be effected by adjusting both resistors 6 and 6' to give equal outputs of the required amplitude at terminal 19 for a defined input current; alternatively, having equalised the channel gains, calibration can be effected in the circuits beyond terminal 19. The offset voltages of amplifiers 3,3' can be roughly cancelled if excessive selection of fixed resistors 37, 37', but this is not important.

In the described example, the output is shown as taken from the outputs of amplifiers 8 and 8'. A less-amplified ($\div 100$) zero-corrected output can alternatively be taken at the inputs to amplifiers 8 and 8' and a more amplified ($\times 100$) zero-corrected output from the outputs of amplifiers 9 and 9'. These alternative outputs can be fed to switch 16, together with those shown, through appropriate switches to provide a range-change facility.

A still higher degree of zero-correction can be obtained if desired by applying a similar form of correction to the converters 3 and 3' themselves in order to ensure that the input circuitry from terminal 1 up to and including the inputs to the amplifiers 3,3' is held as close as possible to zero voltage, eg within 0.1 $\mu$V, thereby reducing any errors due to input leakage currents arising from the leakage resistance of the input circuitry. Such an arrangement is shown by the interrupted-line circuitry in FIG. 1. The output from converter 3, for example, is fed via a c-mos switch 33 to an amplifier 34 having a capacitor 35 connected between input and output to form an integrator and store circuit whose output is fed to minimise the offset voltage of amplifier 33 (ie the difference between its two terminals for zero output) by control of its operating conditions. Switch 33 is open while the channel is measuring input current and closed while generating the correction voltage, in the same way as switch 10. During this period the high-value resistor 4 is reduced to a relatively low value, eg 1M, to avoid bias-current errors, by short-circuiting part of it by c-mos switch 36 closed in synchronism with switch 33. The other channel is similarly equipped. However, for many applications this refinement will not be necessary.

Unlike existing amplifiers, the present amplifier requires no zero-setting procedure since it will automatically give zero output for zero current input. It can also handle input currents of either polarity without modification, the output polarity being dependent on the input current polarity.

The described example (without the additional correction provided by the interrupted-line circuitry), is capable of a dynamic range of at least $10^{-15}$ or $10^{-10}$ A of either polarity, with a worst-case error (due to drift) of less than 0.1% at $2\times 10^{-15}$ A.

I claim:

1. A current amplifier comprising:
    two similar amplifier channels each comprising a current-to-voltage converter connected to respective DC voltage-amplifying means;
    each channel further comprising integrator and store means for integrating the non-zero output of said voltage-amplifying means in the absence of an input signal to said converter, said integrator and store means having its input connectable to the output of said voltage amplifying means and its output permanently connected to the input of said voltage-amplifying means for feeding a zero-correcting current thereto corresponding to the stored value;
    switch means for connecting an input current terminal to the input of each said converter during alternate time periods;
    switch means for connecting an output terminal of the current amplifier to a zero-corrected point in each said voltage-amplifying means in synchronism with said connection of the input current terminal to the input of the corresponding converter;
    switch means for disconnecting each said integrator and store means from the output of each said voltage-amplifying means while said input terminal is connected to the converter in that channel;
    and timing means for periodically operating said switch means thereby to switch the input current between said two channels.

2. An amplifier as claimed in claim 1 wherein said output terminal is preceded by a series-connected switch means operable by said timing means to open for a short period starting before said input current terminal is switched from one channel to the other.

3. An amplifier as claimed in claim 2 including voltage storage means connected between said series-connected switch means and the output terminal.

4. An amplifier as claimed in claim 1 wherein each current-to-voltage converter comprises an operational amplifier including a feedback resistor connected between its input and output through which flows current from said input current terminal.

5. An amplifier as claimed in claim 4 wherein each channel comprises a further integrator and store means, said further integrator and store means acting to integrate the non-zero output of each said current-to-voltage converter in the absence of an input signal to said converter, each said further integrator and store means having its input switchably connectable to the output of a respective said converter only when the converter input is disconnected from the input terminal and having its output permanently connected to control the operating conditions of the operational amplifier of said converter in a manner to minimise its offset voltage.

6. An amplifier as claimed in claim 4 wherein each integrator and store means comprises an operational amplifier having a capacitor connected between its input and output, a resistor switchably connectable between its input and the output of the respective voltage-amplifying means, and a resistor connected between its output and the input of said respective voltage-amplifying means.

7. An amplifier as claimed in claim 6 wherein said output terminal is preceded by a series-connected switch means operable by said timing means to open for a short period starting before said input current terminal is switched from one channel to the other.

8. An amplifier as claimed in claim 4 wherein said output terminal is preceded by a series-connected switch means operable by said timing means to open for a short period starting before said input current terminal is switched from one channel to the other.

9. An amplifier as claimed in claim 8 including voltage storage means connected between said series-connected switch means and the output terminal.

10. An amplifier as claimed in claim 1 wherein each integrator and store means comprises an operational amplifier having a capacitor connected between its input and output, a resistor switchably connectable between its input and the output of the respective voltage-amplifying means, and a resistor connected between its output and the input of said respective voltage-amplifying means.

11. An amplifier as claimed in claim 7 including voltage storage means connected between said series-connected switch means and the output terminal.

12. An amplifier as claimed in claim 10 wherein said output terminal is preceded by a series-connected switch means operable by said timing means to open for a short period starting before said input current terminal is switched from one channel to the other.

13. An amplifier as claimed in claim 1 including voltage storage means connected between said series-connected switch means and the output terminal.

14. An amplifier as claimed in claim 1 whereing said input terminal switch means comprises two reed switches including actuating coil means, each switch having one reed contact connected to said input terminal and another reed contact connected to the input of a respective current-to-voltage converter, and includes permanent magnet means to magnetically bias the respective switches in opposite senses.

15. An amplifier as claimed in claim 14 wherein the magnet means is arranged to bias the switches to a state in which they are switchable between stable make and break conditions by short pulses of opposite polarity applied to said actuating-coil means.

16. An amplifier as claimed in claim 15 wherein the actuating coil means comprises a coil located between the two switches and having a centre tapping connected to a neutral potential and switching connections to apply pulses of opposite polarities simultaneously to both ends.

17. An amplifier as claimed in claim 16 wherein the magnet means comprises a separate magnet for each switch.

18. An amplifier as claimed in claim 17 wherein each switch is located between said coil and the respective magnet.

19. An amplifier as claimed in claim 7 wherein the magnet means comprises a separate magnet for each switch.

* * * * *